United States Patent
Sudo

[11] Patent Number: 6,121,770
[45] Date of Patent: Sep. 19, 2000

[54] MAGNETIC SENSOR USING MAGNETIC IMPEDANCE OF MAGNETIC WIRE WITHIN BIASING COIL

[75] Inventor: Yoshihiro Sudo, Miyagi-ken, Japan

[73] Assignee: Frontec Incorporated, Miyagi-ken, Japan

[21] Appl. No.: 09/100,731

[22] Filed: Jun. 19, 1998

[30]     Foreign Application Priority Data

Jul. 14, 1997  [JP]  Japan .................................. 9-188511
Jul. 14, 1997  [JP]  Japan .................................. 9-188512

[51] Int. Cl.$^7$ ........................... G01R 33/02; G11B 5/127; G11B 5/33
[52] U.S. Cl. ........................... 324/244; 324/260; 360/110
[58] Field of Search .................................. 324/244, 252, 324/260, 256, 257, 258; 360/111, 113, 110

[56]              References Cited
              U.S. PATENT DOCUMENTS 5,751,112   5/1998   Monma et al. .............................. 315/8
5,764,055   6/1998   Kawase ................................... 324/249

FOREIGN PATENT DOCUMENTS 07181239A   7/1995   Japan .

*Primary Examiner*—Christine K. Oda
*Assistant Examiner*—Henry S. Andersen
*Attorney, Agent, or Firm*—Brinks Hofer Gilson & Lione

[57]              ABSTRACT

In a magnetic impedance device according to the present invention, an approximately uniformly biased magnetic field is applied to a sensing part of a magnetic wire in a longitudinal direction by setting the range of winding of a coil. The sensing part is composed of magnetic material with high permeability and is disposed between a pair of mounting pins. The coil is wound around the sensing part of the magnetic wire and generates a biasing magnetic field. The range of winding of the coil is longer than the sensing part. This arrangement allows the sensing part of the magnetic wire to detect external magnetic fields without problems caused by edge effects from the ends of the coil, thereby enhancing the precision of detection.

16 Claims, 11 Drawing Sheets

6,121,770

MAGNETIC SENSOR USING MAGNETIC IMPEDANCE OF MAGNETIC WIRE WITHIN BIASING COIL

BACKGROUND OF THE INVENTION

1. Field of the Invention

The present invention relates to a magnetic sensor as a device for a sensitive micro magnetic sensor such as a magnetic head of audio visual (AV) equipment, control equipment, a computer and others or a magnetic impedance effect device, a magnetic inductance device and others respectively suitable for a direction finder and others.

2. Description of the Related Art

Recently, the need for miniaturization and sensitization of a magnetic sensor has increased. As a result, a magnetoresistance effect device (magnetoresistance device or MR) that detects magnetic flux, not the change in time of the magnetic flux, has been actively researched for use as a head. Such an MR device utilizes a phenomenon in which the electrical resistance due to the interaction between the magnetization of a ferromagnetic body and the conduction electrons of a DC current varies by an external magnetic field. This MR device is effective for the promotion of miniaturization. However, until now, since the rate of change of electrical resistance of the MR device has been very small, the signal-to-noise ratio (S/N ratio) is not sufficient. Therefore, there is a problem in that it is difficult to obtain the desired detection sensitivity.

Also recently, the research of a giant magnetoresistance effect device (GMR device) which detects the change of an external magnetic field utilizing a phenomenon called giant magnetoresistance effect is also widely conducted, however, in the case of such a GMR device, the rate of change of electric resistance is also not sufficient and as there is also a problem of hysteresis, giant magnetoresistance effect is not a technique suitable for the acceleration of miniaturization.

As a sensitive micro magnetic sensor which can solve the problems of the above MR device and GMR device, such a magnetic impedance effect device (hereinafter called an MI device) as disclosed in Japanese Published Unexamined Patent Application No. Hei 7-181239 is proposed. Such an MI device utilizes an electromagnetic phenomenon that when high frequency current is fed to a magnetic wire composed of a magnetic substance with high permeability, impedance by skin effect is greatly varied by an external magnetic field. For example, as a change of 50% or more of impedance can be obtained by a magnetic field of a few gauss when an amorphous wire 1 to 3 mm long and approximately 30 μm in diameter is used for a magnetic wire, a compact and sensitive magnetic sensor can be provided.

FIG. 20 is a characteristic drawing showing correlation between voltage generated between both ends of an amorphous magnetic wire when frequency current of a sine wave of 100 kHz or more is applied in such an MI device and an external magnetic field and shows a state in which voltage between both ends of the magnetic wire varies according to the intensity of the external magnetic field. However, as shown in FIG. 20, as the change of voltage between both ends of the magnetic wire (a sensing part which serves the detection of an external magnetic field) is symmetrical based upon when an external magnetic field is zero gauss, an operating point (coordinates showing a state in which an external magnetic field is zero) is required to be shifted to a suitable position in which the linearity of a graph can be secured such as a point A in FIG. 20 in case the above MI device is used for a sensor which can detect not only the intensity of an external magnetic field but the direction as well.

Therefore, in such a case, heretofore, a magnetic wire 2 is inserted into a tube 1 composed of a non-magnetic substance such as vinyl as shown in FIG. 21, a biased magnetic field Hb is applied to the magnetic wire 2 by feeding direct current to a coil 3 wound by a predetermined number of turns on the peripheral surface of the tube 1 and an operating point is set. Both ends of the magnetic wire 2 are soldered to a conductor, a soldering land or others, the magnetic wire 2 between a pair of solder connections 4 becomes a sensing part which serves the detection of an external magnetic field and the intensity and the direction of an external magnetic field can be detected by measuring voltage in the sensing part.

However, as the shape of a graph showing correlation between voltage in the sensing part of the magnetic wire 2 and an external magnetic field varies when a biased magnetic field Hb is applied to the magnetic wire 2 by the coil 3, a conventional type MI device has a problem that a desired operating point cannot be set. That is, assuming that a uniform biased magnetic field Hb is applied to the whole sensing part of the magnetic wire 2, correlation between voltage and an external magnetic field is shown as a characteristic curve obtained by shifting the graph shown in FIG. 20 by Hb to the left as shown by a chain line in FIG. 22 and the shape itself of the graph should be unchanged. However, in fact, as shown by a full line in FIG. 22, it is clear from experiments by the inventors of the present invention that the shape of the graph is a characteristic curve different from the shape of the graph shown in FIG. 20. The reason is thought to be that the coil 3 for applying a biased magnetic field does not generate a desired magnetic field at both ends of the wound part.

That is, the intensity of a magnetic field generated by feeding direct current to the coil for applying a biased magnetic field is approximately uniform in a part except both ends of the wound part as shown in FIG. 23, however, it is known that a generated magnetic field is rapidly decreased near both ends of the wound part. Therefore, when the sensing part of the magnetic wire is influenced by a magnetic field generated at both ends of the wound part of the coil, the intensity of a biased magnetic field applied to the sensing part is dispersed in the longitudinal direction and this is thought to change the shape of the graph showing correlation between voltage and an external magnetic field when a biased magnetic field is applied.

As shown in FIG. 22, when a biased magnetic field uneven in the longitudinal direction is applied to the sensing part of the magnetic wire, an error occurs even if voltage in the sensing part is measured and an external magnetic field is detected. This is because the linearity of a graph showing correlation between voltage and an external magnetic field is not satisfactory in the vicinity of an operating point B at which a biased magnetic field is set to Hb, and the precision of detection is deteriorated.

Further, in the above conventional type MI device, the coil 3 for applying a biased magnetic field is wound on the tube 1 made of vinyl and others, however, as the outside diameter of the tube 1 is set to approximately 0.5 mm, the length is set to approximately 1 to 3 mm and the tube 1 is small, assembly operation that the coil 3 is wound on the peripheral surface by a few tens of turns or more is not easy and handleability is unsatisfactory.

In such a conventional type MI device, the end of the magnetic wire 2 is electrically and mechanically connected to a conductor and others by soldering, however, as the wettability of the magnetic wire 2 composed of an amorphous wire and other materials is low, sufficient attachment strength and the reliability of conduction in the solder connection 4 which solders the end cannot be expected.

SUMMARY OF THE INVENTION

An object of the present invention is to apply an approximately uniform biased magnetic field in the longitudinal direction of a sensing part by setting the wound range of a coil for applying a biased magnetic field so that it is longer than the sensing part of a magnetic wire and to enhance the precision of detection.

Further, another object of the present invention is to enable a coil to be readily wound around a magnetic wire, to facilitate the handling by winding the coil for applying a biased magnetic field on a supporting board for supporting the magnetic wire and to enhance the attachment strength of the magnetic wire and the reliability of conduction by using a magnetic wire attachment member which can temporarily fix the magnetic wire to the above supporting board.

DESCRIPTION OF THE PREFERRED EMBODIMENTS

Figure 1:
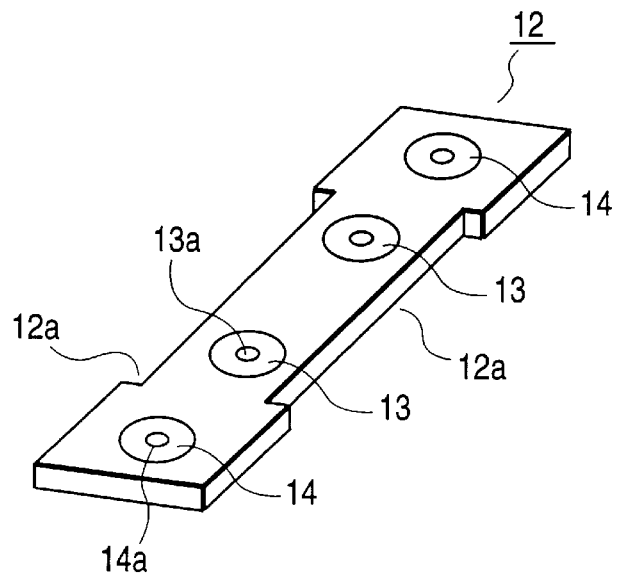
FIG. 1 is a perspective drawing showing a supporting board used in a first embodiment.

A magnetic sensor according to the present invention is provided with a magnetic wire composed of a magnetic substance with high permeability and of which the voltage generated by applying current which varies with time is varied by the change of an external magnetic field, a pair of conductive members respectively electrically connected to both ends of a sensing part which serves the detection of the external magnetic field out of the above magnetic wire and a coil wound around the above magnetic wire for applying a biased magnetic field. A range in which the coil is wound is set so that the range includes an electric connection (a solder connected part) between the magnetic wire and the pair of conductive members and is longer than the sensing part of the magnetic wire.

As described above, as an uneven magnetic field caused at both ends of the wound part of the coil is unlikely to have an effect upon the sensing part of the magnetic wire if the range in which the coil for applying a biased magnetic field is wound is set so that the range is longer than the sensing part of the magnetic wire, an approximately uniform biased magnetic field can be applied in the longitudinal direction of the sensing part. Therefore, a graph showing a correlation between voltage in the sensing part of the magnetic wire and an external magnetic field is shifted by the quantity of a biased magnetic field without approximately changing the shape and it becomes possible to set an operating point on desired coordinates on which the linearity of the graph can be secured.

The above conductive members are not required to be located in the wound range of the coil and at least a part of solder for electrically connecting the magnetic wire and the conductive members has only to be located in the wound range of the coil, however, it is desirable that the conductive members are located in the wound range of the coil. Further, even if the wound position of the coil and others are dislocated if the coil is wound twice or more as long as the sensing part of the magnetic wire, the sensing part of the magnetic wire can be securely located in the wound area of the coil. For the magnetic wire, a magnetic wire composed of a magnetic substance with high permeability is desirable and particularly, an amorphous magnetic wire with high permeability is desirable.

A magnetic sensor according to the present invention is provided with a magnetic wire composed of a magnetic substance with high permeability and of which the voltage generated by applying current which varies with time is varied by the change of an external magnetic field, a supporting board for supporting the magnetic wire and a coil wound around the magnetic wire for applying a biased magnetic field, and the coil is wound on the supporting board. It is desirable that a pair of conductive parts such as soldering lands mutually apart are provided to the supporting board and both ends of the sensing part of the magnetic wire are respectively electrically connected to these conductive parts. In addition to such constitution, it is further desirable that a magnetic wire attachment member attached to the supporting board in a state in which the magnetic wire is held between the magnetic wire attachment member and the supporting board is provided and the magnetic wire attachment member is soldered to the above conductive parts of the supporting board.

As described above, if the coil is wound on the supporting board for supporting the magnetic wire, assembling and handling of the magnetic sensor are facilitated, compared with a case that a coil is wound on a tube made of vinyl and other materials. The magnetic wire can be temporarily fixed to the supporting board and if the magnetic wire attachment member provided with better wettability than that of the magnetic wire is used, the strength of the attachment of the magnetic wire and the reliability of conduction can be greatly enhanced by securely soldering the attachment member to the conductive parts of the supporting board.

The axis of the coil can be set so that it is approximately equal to the axis of the magnetic wire by providing a cover member for covering the magnetic wire on the supporting board and winding the coil on the cover member and the supporting board, a biased magnetic field approximately parallel to a direction in which the magnetic wire is extended (a longitudinal direction) is readily applied to the magnetic wire.

A positioning part such as a notch for regulating the position or the wound range of the coil is provided to the supporting board or the cover member to further facilitate assembly.

First Embodiment

Figure 2A:
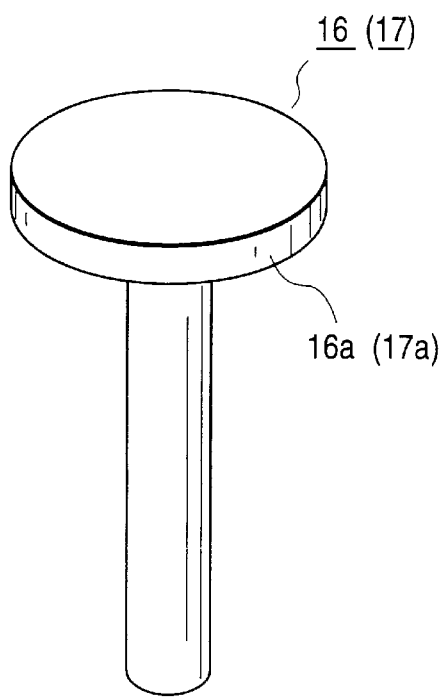
FIG. 2 are a perspective drawing and a front view respectively showing a mounting pin used in the first embodiment.
Figure 4:
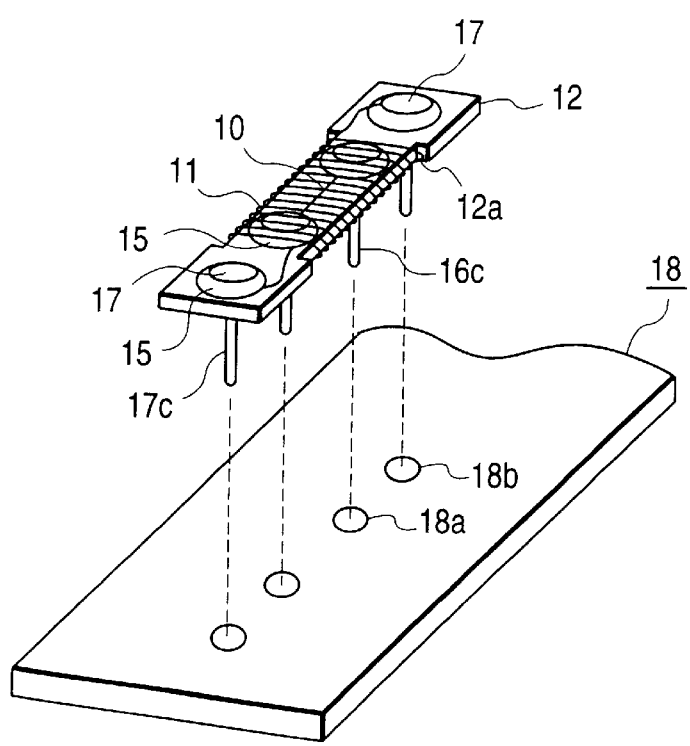
FIG. 4 is an explanatory drawing showing a state in which an MI device equivalent to the first embodiment is mounted on a circuit board.
Figure 5:
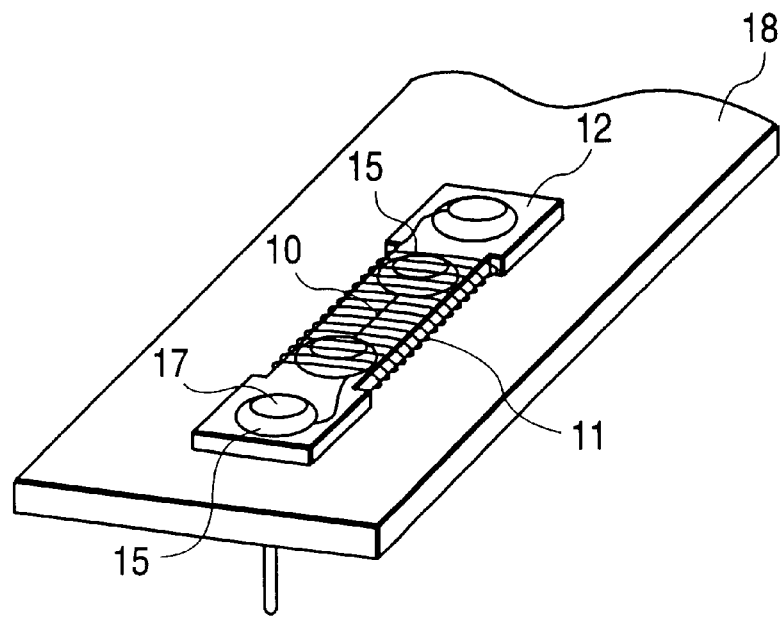
FIG. 5 is a perspective drawing showing a state in which the mounting of the MI device equivalent to the first embodiment on the circuit board is completed.
Figure 6:
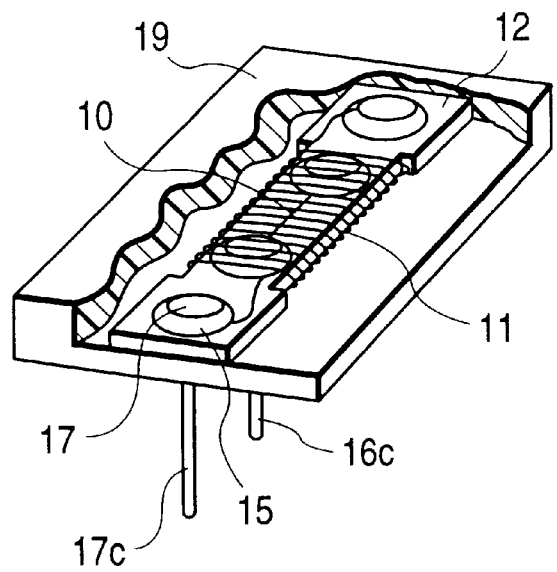
FIG. 6 is a partly broken perspective drawing showing a case that the MI device equivalent to the first embodiment is sealed in insulating resin and packaged.

Referring to the drawings, embodiments will be described below. FIGS. 1 to 6 explain a first embodiment of the present invention, FIG. 1 is a perspective drawing showing a supporting board used in the first embodiment, FIG. 2 are a perspective drawing and a front view respectively showing a mounting pin used in the first embodiment, FIG. 3 is an explanatory drawing showing an assembling procedure in the first embodiment, FIG. 4 is an explanatory drawing showing a state in which an MI device (a magnetic sensor) equivalent to the first embodiment is mounted on a circuit board, FIG. 5 is a perspective drawing showing a state in which the mounting of the MI device shown in FIG. 4 on the circuit board is completed, and FIG. 6 is a partly broken perspective drawing showing a case that the MI device equivalent to the first embodiment is sealed in insulating resin and packaged.

As shown in these drawings, a reference number 10 denotes a linear magnetic wire which is an amorphous wire made of a magnetic substance with high permeability, 11 denotes a coil for applying a biased magnetic field to the magnetic wire 10, 12 denotes a rigid supporting board for supporting the magnetic wire 10 and the coil 11, 13 denotes a pair of soldering lands which are provided on the supporting board 12 and to which the both ends of the magnetic wire 10 are soldered, 14 denotes a pair of soldering lands which are similarly provided outside the above soldering lands 13 on the supporting board 12 and to which both ends of the coil 11 are soldered, 15 denotes solder, 16 denotes a pair of magnetic wire mounting pins piercing the supporting board 12 for holding both ends of the magnetic wire 10, 17 denotes a pair of coil mounting pins piercing the supporting board 12 for holding both ends of the coil 11, 18 denotes a circuit board which is a mother board (a main board) on which the supporting board 12 is mounted, and 19 denotes a mold composed of insulating resin inside which an MI device is sealed.

Described in detail, for the above magnetic wire 10, an amorphous wire composed of Fe (4.35), Co (68.15), Si (12.5) and B (15) and obtained by dicing an as-cast wire of which the magnetostriction is approximately zero so that the diameter is 30 $\mu$m is used, and the tension of 2 kg/mm$^2$ and annealing at 475° C. for 15 seconds are applied to the magnetic wire 10. The length of a sensing part (a part stretched between a pair of magnetic wire mounting pins 16 and exposed from the solder 15, that is, a part located between a pair of soldering lands 13) which serves the detection of an external magnetic field out of the magnetic wire 10 is 3 mm. A part outside the sensing part such as a part embedded in the solder 15 out of the magnetic wire 10 does not directly serve the detection of an external magnetic field, however, as the amorphous magnetic wire readily absorbs a magnetic flux, the effect of magnetism can be expected if both ends of the magnetic wire 10 are slightly extended outside the solder 15.

For the above supporting board 12, in this embodiment, an epoxy resin board including glass approximately 14 mm long, 4 mm in width and approximately 1 mm thick is used and the above soldering lands 13 and 14 composed of copper foil are formed in a predetermined location on the supporting board 12 by well-known technique such as etching. A notch 12a with the length of 8 mm is provided as a positioning part for regulating the position and the wound range of the coil 11 on both sides of the supporting board 12, the soldering lands 13 are located inside both ends in the longitudinal direction of the notch 12a and the soldering lands 14 are located outside both ends. Furthermore, a mounting hole 13a for the mounting pin 16 is provided in the center of the soldering land 13 on the supporting board 12 and similarly, a mounting hole 14a for the mounting pin 17 is provided in the center of the soldering land 14. The supporting board 12 may be also formed by another insulating material of a non-magnetic substance such as phenol resin.

Figure 2B:
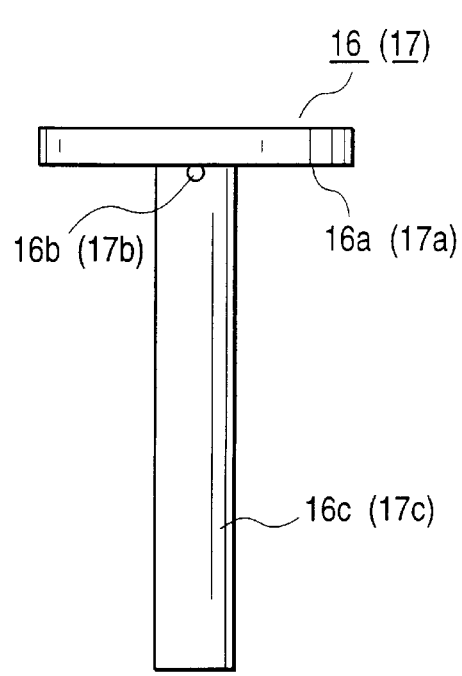

The above mounting pins 16 and 17 are pins in a shape shown in FIG. 2 and are composed of material with much better wettability than that of a magnetic wire made of brass plated with gold on a nickel substrate, phosphor bronze plated with solder on a copper substrate or other materials. Through holes 16b and 17b for inserting each end of the magnetic wire 10 and the coil 11 are made at the base of the head 16a and 17a of each mounting pin 16 and 17 as shown in FIG. 2B. As shown in FIG. 3, the magnetic wire mounting pin 16 is inserted so that the through hole 16b fronts the longitudinal direction of the supporting board 12 and the coil mounting pin 17 is inserted so that the through hole 17b fronts the direction of the width (the shorter direction) of the supporting board 12.

The coil 11 is composed of an enameled wire 100 $\mu$m in diameter, which is wound around the magnetic wire 10. For example, the number of turns of the coil 11 is 100. However, as shown in FIGS. 3 to 5, the coil 11 is wound on only a part between a pair of notches 12a of the supporting board 12 and the wound range of the coil 11 is determined by these notches 12a. The above enameled wire is formed by coating a copper wire with a polyurethane film.

Figure 3A:
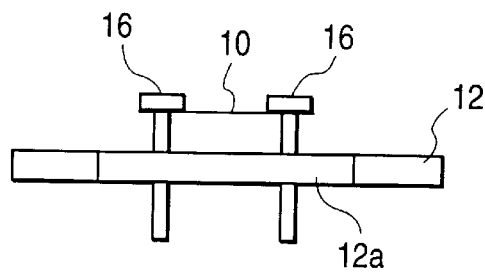
FIG. 3 are explanatory drawings showing an assembling procedure in the first embodiment.

When an MI device is assembled using the above, first, the end of the magnetic wire 10 is inserted into each through hole 16b of a pair of magnetic wire mounting pins 16 and as shown in FIG. 3A, these mounting pins 16 are respectively inserted into the mounting hole 13a in each soldering land 13 of the supporting board 12. Hereby, as each end of the magnetic wire 10 can be held between the head 16a of each mounting pin 16 and the soldering land 13 on the supporting board 12, the magnetic wire 10 can be temporarily fixed in a predetermined position.

Figure 3B:
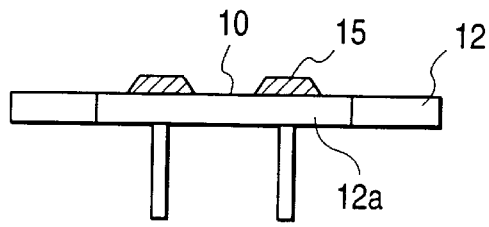

Next, as shown in FIG. 3B, each mounting pin 16 and the corresponding soldering land 13 are soldered on the soldering land 13 by solder 15. At this time, as wettability is satisfactory, the mounting pin 16 is firmly soldered on the soldering land 13 and therefore, the end of the magnetic wire 10 held between the mounting pin 16 and the soldering land 13 can also be securely held in the solder 15.

Figure 3C:
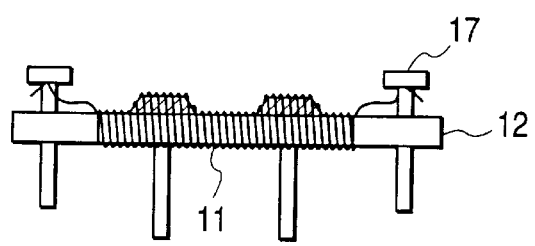

Afterward, the coil 11 is wound on the supporting board 12 by a predetermined number of turns (for example, by 100 turns) utilizing the above notches 12a. That is, the coil 11 is wound from one end to the other end in the longitudinal direction of the notch 12a and the coil 11 is wound around the magnetic wire 10. However, as a pair of magnetic wire mounting pins 16 soldered on each soldering land 13 are located inside both ends in the longitudinal direction of the notch 12a, both ends of a part in which the coil 11 is wound are located outside the mounting pins 16 as shown in FIG. 3C.

Afterward, both ends of the coil 11 are respectively held between the head 17a of each mounting pin 17 and the corresponding soldering land 14 by respectively inserting both ends of the coil 11 into each through hole 17b of a pair of coil mounting pins 17, respectively inserting these mounting pins 17 into each mounting hole 14a in the soldering lands 14 and piercing the supporting board 12. One MI device shown in FIG. 4 is completed by soldering both ends of the coil 11 temporarily fixed as described above on the corresponding soldering land 14.

Insulating epoxy resin composed of non-magnetic material is applied to the magnetic wire 10 and the coil 11 of such an MI device and hardened to prevent disconnection, though the above resin film is not shown.

As in the MI device constituted as described above, the coil 11 is wound on the supporting board 12 for supporting the magnetic wire 10, the operation of winding the coil 11 and assembling are facilitated and the handling is also facilitated, compared with a case that a coil is wound on a tube made of vinyl and other materials. In addition, as the notches 12a for regulating the position and the wound range of the coil 11 are provided to the supporting board 12, the facility of assembling and the reliability when the coil 11 is wound are further enhanced.

As in the above MI device, the magnetic wire mounting pin 16 which can temporarily fix the end of the magnetic wire on the supporting board 12 during assembly can be securely soldered on the soldering land 13, the attachment strength and the reliability of the conduction of the magnetic wire 10 are greatly enhanced. In addition, as the coil mounting pin 17 which temporarily fixes the coil 11 outside the wound range and is soldered on the soldering land 14 is mounted on the supporting board 12, the magnetic wire mounting pin 16 and the coil mounting pin 17 eventually function as terminals and an MI device which is easy to handle is completed.

As the above MI device is designed so that both ends of the wound part of the coil 11 are respectively located outside the sensing part (the part which serves the detection of an external magnetic field) of the magnetic wire 10 stretched between a pair of magnetic wire mounting pins 16, and a biased magnetic field generated when electricity is conducted to a part wound around the magnetic wire 10 of the coil 11 becomes approximately uniform in the longitudinal direction of the magnetic wire 10. That is, as there is a characteristic that a magnetic field generated by the coil 11 is approximately uniform except both ends of the wound part, it is taken into consideration in this embodiment that a magnetic field generated at both ends of the wound part of the coil 11 is prevented from having a bad effect upon the sensing part of the magnetic wire 10 so as to prevent the precision of detection from being deteriorated when an uneven biased magnetic field is applied to the magnetic wire 10. As a graph showing correlation between voltage of the sensing part of the magnetic wire 10 and an external magnetic field is shifted by the quantity of the biased magnetic field with hardly changing the shape when a biased magnetic field is uniform in the longitudinal direction of the magnetic wire 10 as described above, an operating point can be set to desired coordinates on which the linearity of the graph can be secured.

The above MI device can be mounted on the circuit board 18 as a subboard and used as shown in FIGS. 4 and 5. That is, an MI device provided with the mounting pins 16 and 17 as terminals is mounted on the circuit board 18 by respectively inserting the ends 16c and 17c of the mounting pins 16 and 17 of the MI device into terminal inserting holes 18a and 18b of the circuit board 18 on which electronic parts (not shown) are mounted and soldering them from the rear side of the circuit board 18. As described above, as wire bonding is not required for the MI device which can utilize the magnetic wire mounting pin 16 and the coil mounting pin 17 as terminals when the MI device is mounted on the circuit board 18, assembling is facilitated and the productivity of a magnetic sensor is enhanced. In such an MI device, the detection of an external magnetic field is enabled by applying high frequency current to the magnetic wire 10 in a state in which direct current is fed to the coil 11 and a biased magnetic field is generated, however, high frequency current applied to the magnetic wire 10 is not limited to a sine wave and may also be a rectangular pulse.

The above MI device can also be packaged by, through fabrication, sealing inside a mold 19 made of insulating non-magnetic resin such as epoxy resin containing glass and protruding a terminal (the mounting pin 16) led from the magnetic wire 10 and a terminal (the mounting pin 17) led from the coil 11 outside the mold 19. As the ends 16c and 17c of the mounting pins 16 and 17 are utilized for the terminals protruded outside the mold 19, wire bonding is not required and the productivity is enhanced. Such packaging is also enabled by heating and hardening epoxy resin after powder coating and the package of the MI device may be also formed like an IC package.

Second Embodiment

Figure 7:
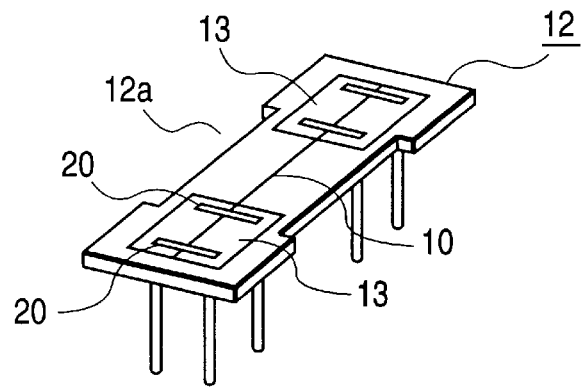
FIG. 7 is a perspective drawing showing a halfway state in assembling an MI device equivalent to a second embodiment.
Figure 8:
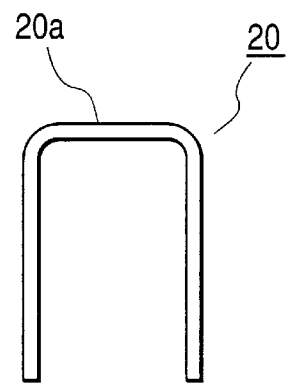
FIG. 8 is a front view showing a mounting pin used in the second embodiment.
Figure 9:
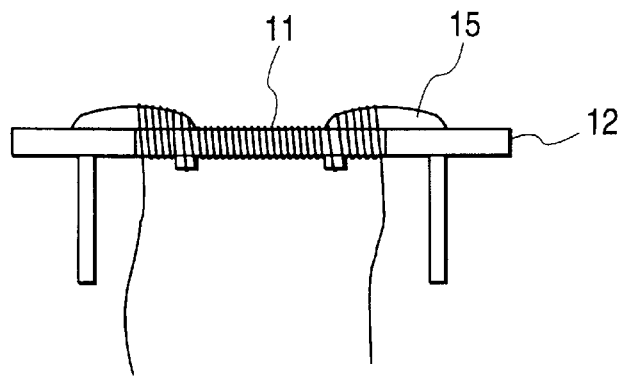
FIG. 9 is a side view showing a finished product of the MI device equivalent to the second embodiment.
Figure 10:
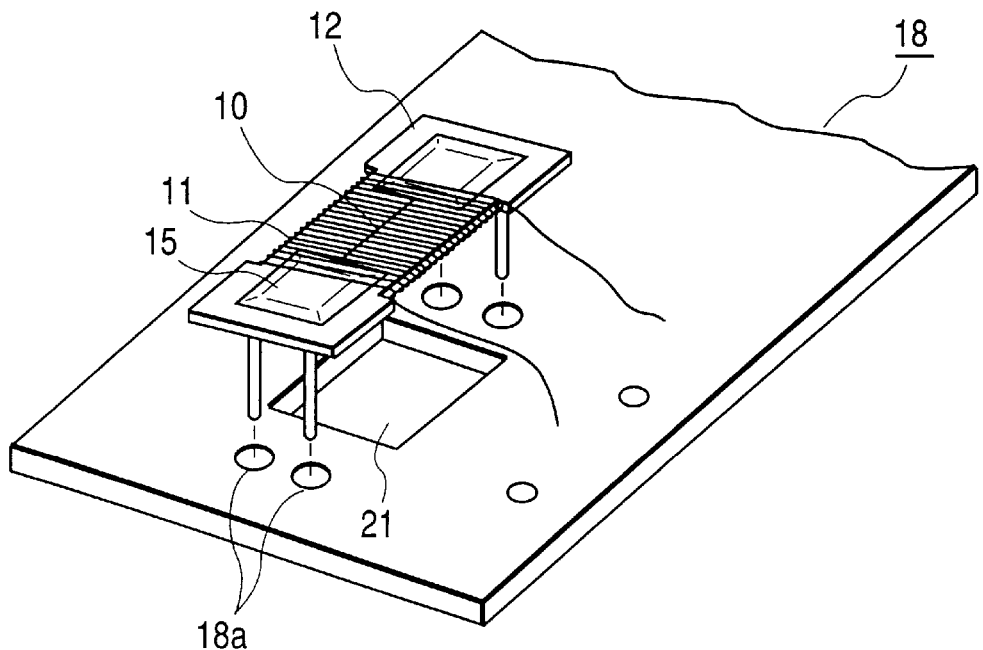
FIG. 10 is an explanatory drawing showing a state in which the MI device shown in FIG. 9 is mounted on the circuit board.
Figure 11:
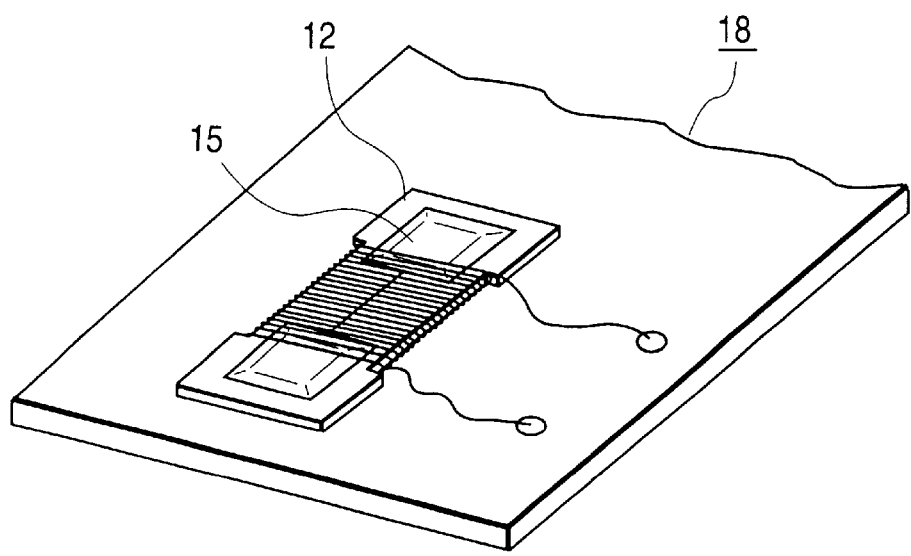
FIG. 11 is a perspective drawing showing a state in which the mounting of the MI device equivalent to the second embodiment on the circuit board is completed.

FIGS. 7 to 11 explain a second embodiment of the present invention, FIG. 7 is a perspective drawing showing a half-way state in assembling an MI device (a magnetic sensor) equivalent to the second embodiment, FIG. 8 is a front view showing a mounting pin used in the second embodiment, FIG. 9 is a side view showing a finished product of the MI device equivalent to the second embodiment, FIG. 10 is an explanatory drawing showing a state when the MI device shown in FIG. 9 is mounted on a circuit board, and FIG. 11 is a perspective drawing showing a state in which the mounting of the MI device on the circuit board shown in FIG. 10 is completed. In these drawings, the same reference number is allocated to a part corresponding to the part in the first embodiment.

In the second embodiment, a total of four U-shaped magnetic wire mounting pins 20 shown in FIG. 8 are used and both ends of a magnetic wire 10 laid on each soldering land 13 are respectively temporarily fixed by the mounting pins 20 at respective two points inside and outside as shown in FIG. 7. That is, mounting holes (not shown) for inserting the legs of two mounting pins 20 are formed in each soldering land 13 on a supporting board 12 so that the end of the magnetic wire 10 can be securely held between the head 20a of each mounting pin 20 and the soldering land 13 by inserting each mounting pin 20 into these mounting holes. As the mounting pin 20 and the soldering land 13 respectively holding the end of the magnetic wire 10 as described above are soldered, the end of the magnetic wire 10 is securely held in solder 15.

As the wound range of a coil 11 is set so that the range is longer than the sensing part, the legs of two inside mounting pins 20 located at both ends of the sensing part of the magnetic wire 10 out of the total four magnetic wire mounting pins 20 are cut before the coil 11 is wound on the supporting board 12. Resin for preventing disconnection is also applied to the magnetic wire 10 and the coil 11 and hardened in the second embodiment as in the first embodiment, though the above resin film is not shown.

As for the second embodiment, a case in which the coil 11 is not soldered on the supporting board 12 but the coil 11 is soldered on the circuit board 18 which is a mother board as shown in FIG. 11 will be described. An opening 21 for housing the wound part and others of the coil 11 when the supporting board 12 is mounted is provided to the circuit board 18 as shown in FIG. 10.

Third Embodiment

Figure 12:
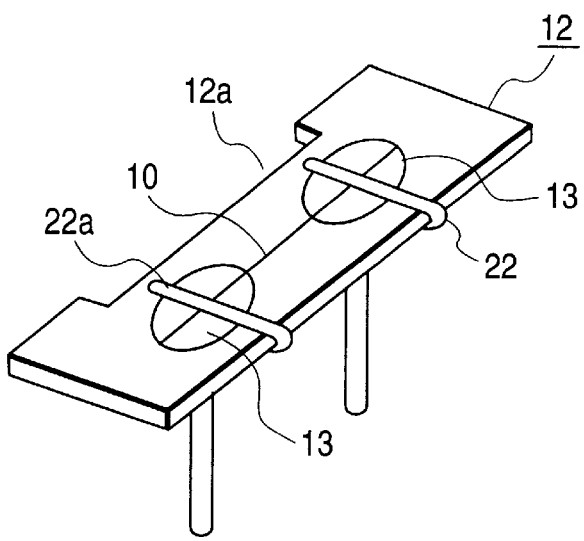
FIG. 12 is a perspective drawing showing a halfway state in assembling an MI device equivalent to a third embodiment.
Figure 13:
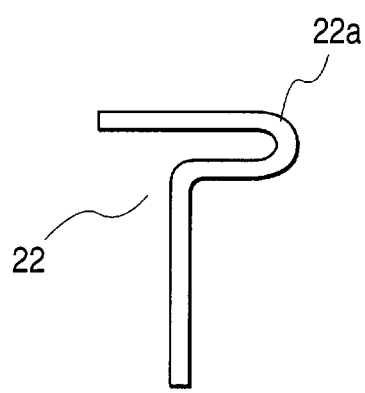
FIG. 13 is a front view showing a mounting pin used in the third embodiment.
Figure 14:
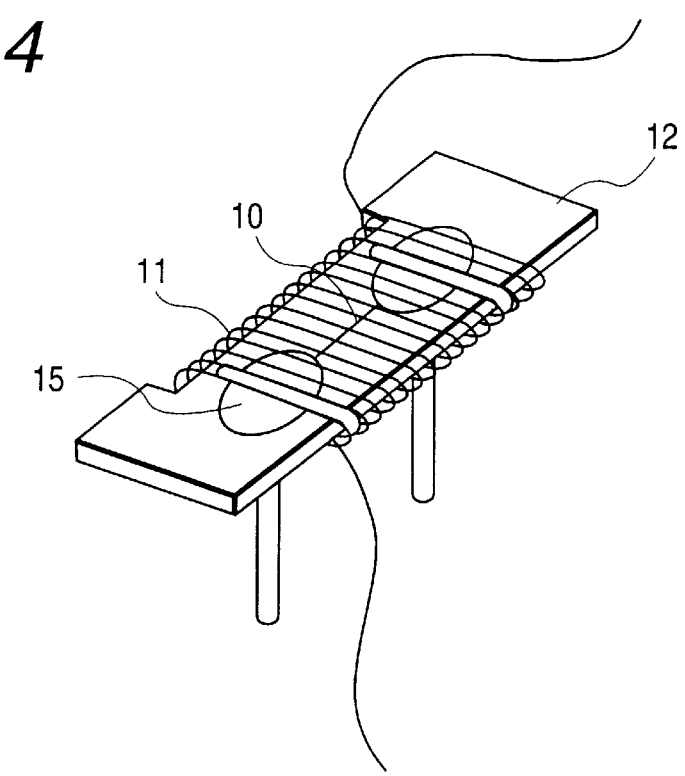
FIG. 14 is a perspective drawing showing a finished product of the MI device equivalent to the third embodiment.

FIGS. 12 to 14 explain a third embodiment of the present invention, FIG. 12 is a perspective drawing showing a halfway state in assembling an MI device (a magnetic sensor) equivalent to the third embodiment, FIG. 13 is a front view showing a mounting pin used in the third embodiment, FIG. 14 is a perspective drawing showing a finished product of the MI device equivalent to the third embodiment and the same reference number is allocated to a part corresponding to the part in the first and second embodiments.

In the third embodiment, the head 22a of a magnetic wire mounting pin 22 is formed in the shape of a clip and the head 22a provided with the property of a spring is attached to a supporting board 12 from the side. Therefore, a mounting hole for inserting the mounting pin 22 is not formed on the supporting board 12 and as shown in FIG. 12, the end of the magnetic wire 10 is held between the head 22a and a soldering land 13 by the property of a spring of the head 22a of the mounting pin 22. As for the third embodiment, a case in which a notch 12a for regulating the wound range of the coil 11 is provided not on both sides of the supporting board 12 but only on one side will be described.

Resin (not shown) for preventing disconnection is also applied to the magnetic wire 10 and the coil 11 in the third embodiment as in the second embodiment and as the coil is also soldered not on the supporting board 12 but on the circuit board (not shown) in the third embodiment. As in the second embodiment, both ends of the coil 11 are free.

Fourth Embodiment

Figure 15:
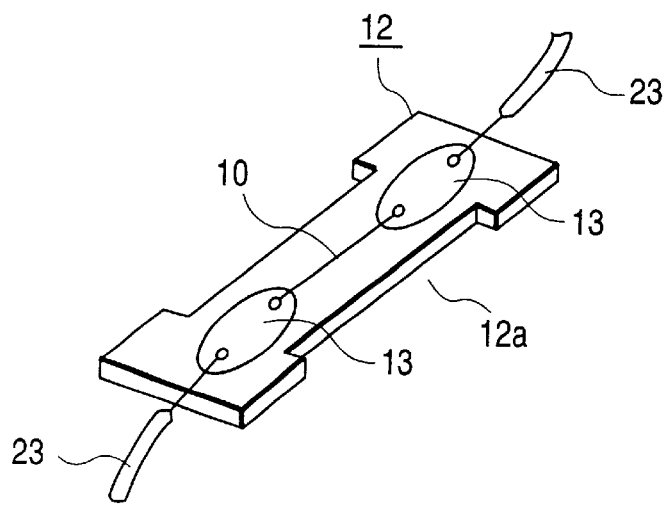
FIG. 15 is a perspective drawing showing a halfway state in assembling an MI device equivalent to a fourth embodiment.

FIG. 15 is a perspective drawing showing a halfway state (before soldering) in assembling an MI device (a magnetic sensor) equivalent to a fourth embodiment of the present invention and the same reference number is allocated to a part corresponding to the part in the first to third embodiments.

In the fourth embodiment, a mounting pin for temporarily fixing both ends of a magnetic wire 10 is not used, and the magnetic wire 10 and a lead wire 23 are conducted by inserting the end of the magnetic wire 10 into one hole provided in a soldering land 13 on a supporting board 12 and soldering in a state in which the lead wire 23 is inserted into the other hole. At that time, if the end of the magnetic wire 10 is temporarily fixed on the supporting board 12 by an adhesive (not shown), the attachment strength and the reliability of the conduction of the magnetic wire 10 can be secured, even if the wettability of the magnetic wire 10 is poor. In the fourth embodiment, the soldering land 13 may also be provided on the rear of the supporting board 12.

Fifth Embodiment

Figure 16:
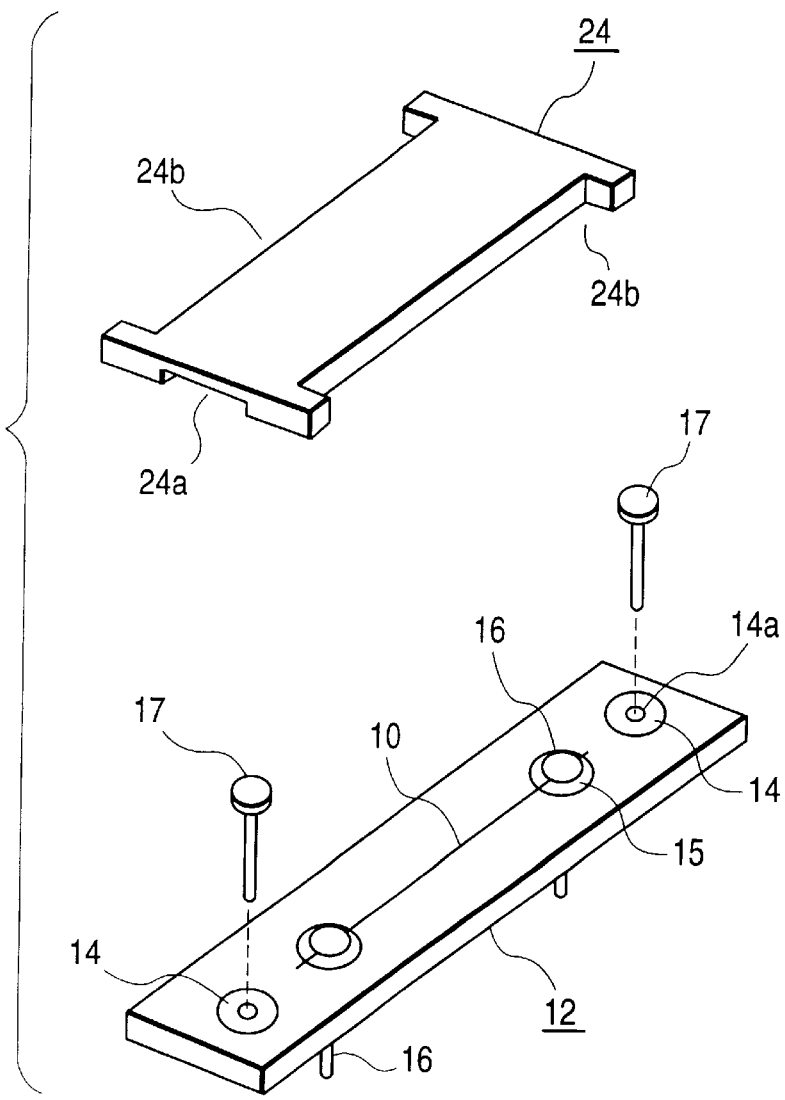
FIG. 16 is a perspective drawing showing a halfway state in assembling an MI device equivalent to a fifth embodiment.
Figure 17:
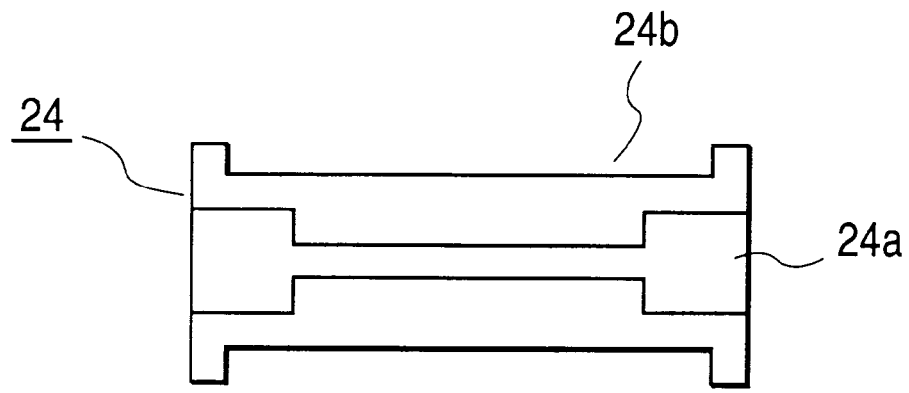
FIG. 17 is a bottom view showing a cover member used in the fifth embodiment.
Figure 18:
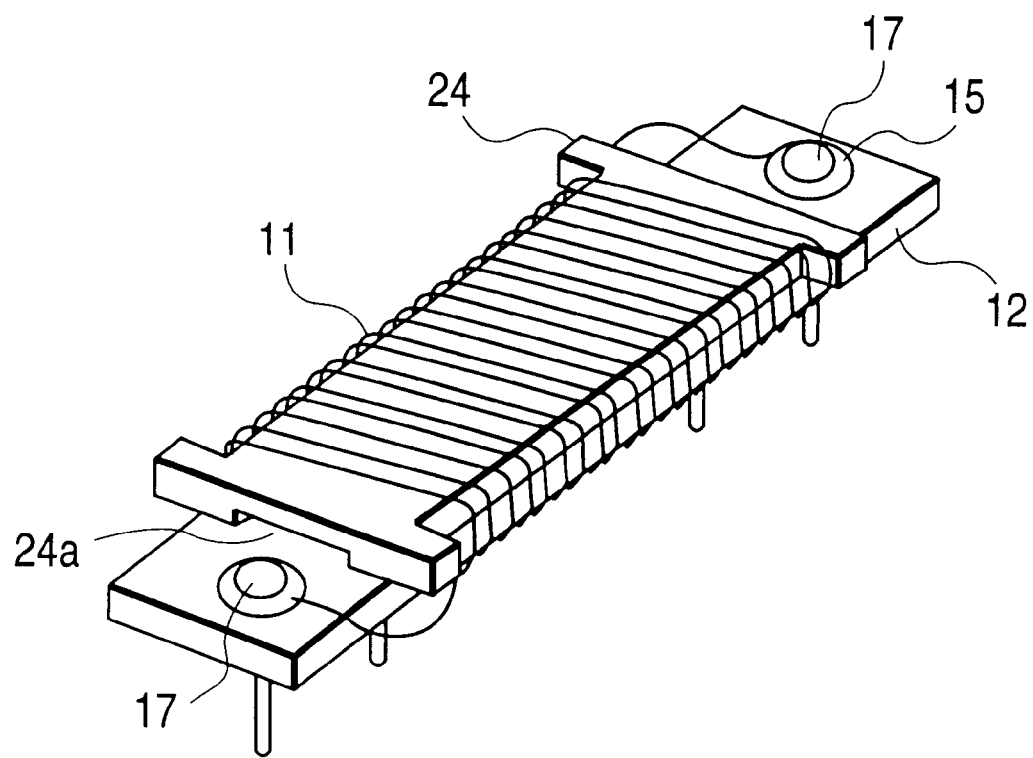
FIG. 18 is a perspective drawing showing a finished product of the MI device equivalent to the fifth embodiment.

FIGS. 16 to 18 explain a fifth embodiment of the present invention, FIG. 16 is a perspective drawing showing a halfway state in assembling an MI device (a magnetic sensor) equivalent to the fifth embodiment, FIG. 17 is a bottom view showing a cover member used in the fifth embodiment, FIG. 18 is a perspective drawing showing a finished product of the MI device equivalent to the fifth embodiment and the same reference number is allocated to a part corresponding to the part in the first to fourth embodiments.

The fifth embodiment is greatly different from the first to fourth embodiments in that a cover member 24 is provided on a supporting board 12 so that the cover member covers a magnetic wire 10 and the axis of a coil 11 wound on the cover member 24 and the supporting board 12 is set so that the axis is approximately equal to the axis of the magnetic wire 10. The cover member 24 is formed by non-magnetic insulating resin such as polyphenylene sulfide (PPS) and is set so that the thickness is approximately equal to that of the supporting board 12. A groove 24a for preventing contact with solder 15 in which the magnetic wire 10 and a magnetic wire mounting pin 16 are soldered on a soldering land (not shown) is formed at the bottom of the cover member 24. In the above embodiments, the notch for regulating the wound range of the coil 11 is provided to the supporting board 12, however, in this embodiment, notches 24b for positioning a coil are provided on both sides of the cover member 24.

As in the MI device in which such a cover member 24 is built, the axis of the wound coil 11 and the axis of the magnetic wire 10 are approximately equalized, the orientation of a biased magnetic field generated by the coil 11 is approximately equal to the longitudinal direction of the magnetic wire 10. As a result, a biased magnetic field with approximately uniform intensity is applied to the magnetic wire 10 in the longitudinal direction of the magnetic wire 10 and the precision of detection can be greatly enhanced.

In the fifth embodiment, resin for preventing disconnection (not shown) is applied to the coil 11. The similar member to the cover member 24 may also be built in the MI devices described in relation to the first to fourth embodiments.

Finally, referring to a circuit diagram shown in FIG. 19, an example of a driving circuit for a magnetic sensor in which the MI device according to the present invention is built will be described.

Figure 19:
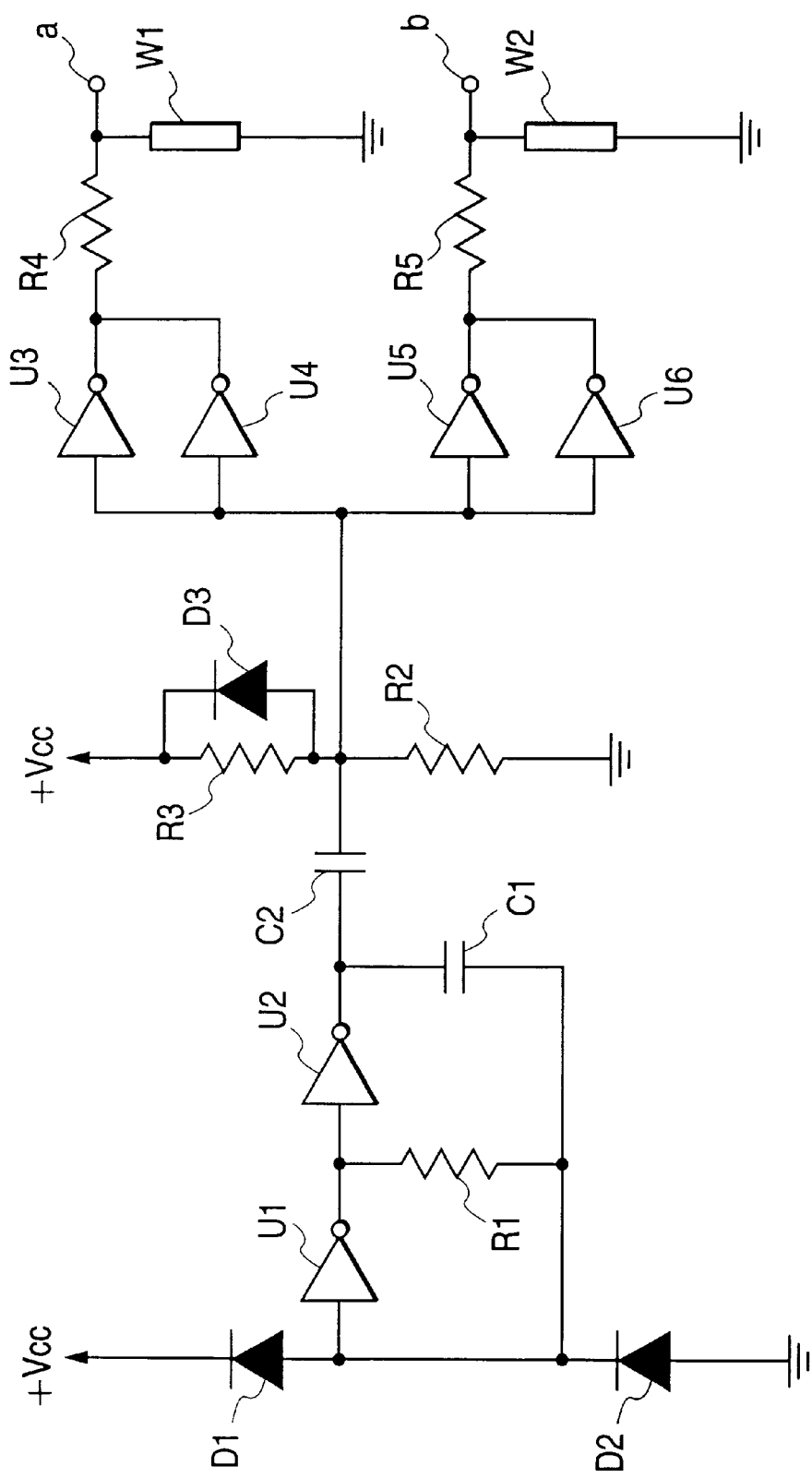
FIG. 19 is a circuit diagram showing an example of a driving circuit for a magnetic sensor according to the present invention.
Figure 20:
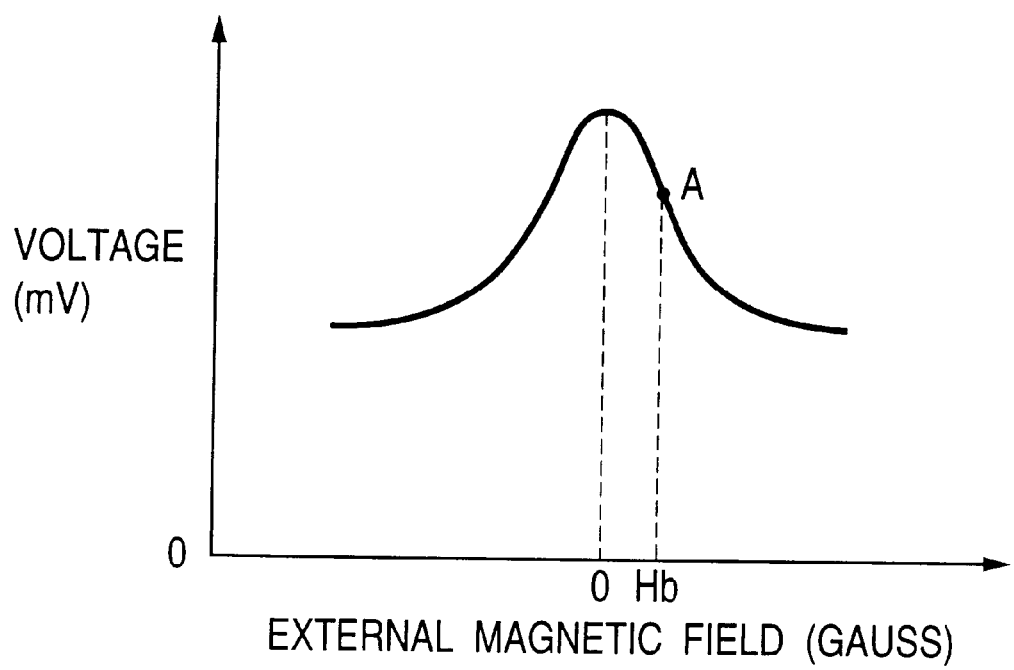
FIG. 20 is a characteristic drawing showing correlation between voltage generated in the sensing part of a magnetic wire and an external magnetic field.
Figure 21:
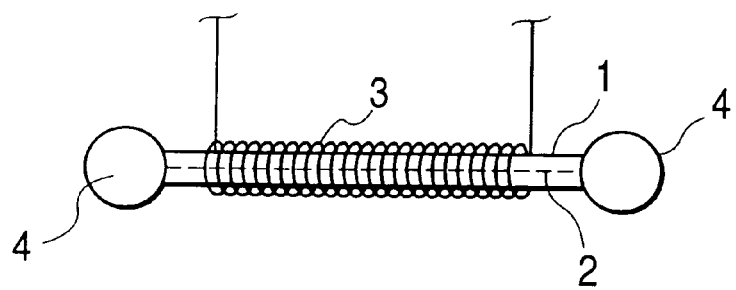
FIG. 21 is a perspective drawing showing a conventional type MI device in which a coil for applying a biased magnetic field is wound around the magnetic wire.
Figure 22:
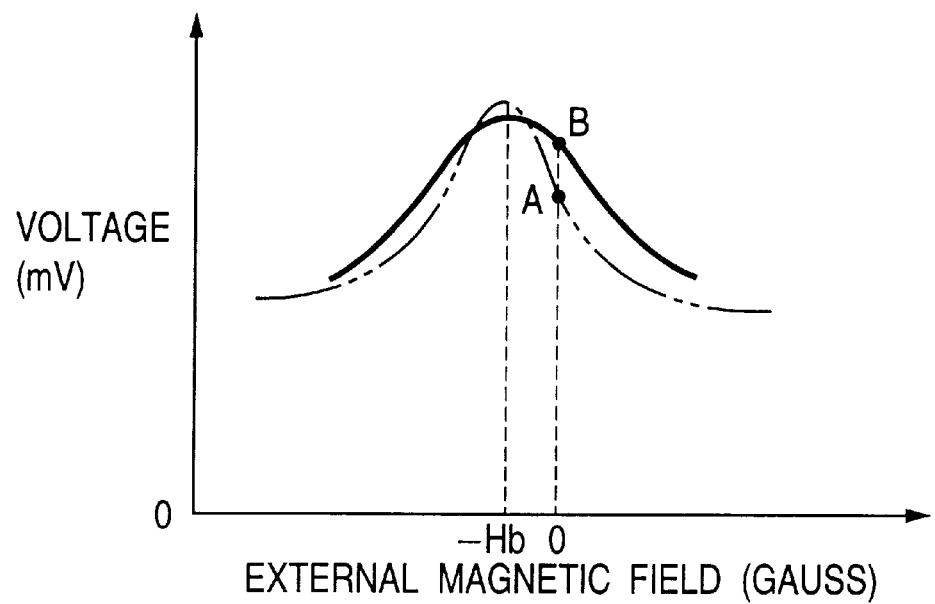
FIG. 22 is a characteristic drawing showing correlation between voltage generated in the sensing part of the magnetic wire when a biased magnetic field Hb is applied and an external magnetic field.
Figure 23:
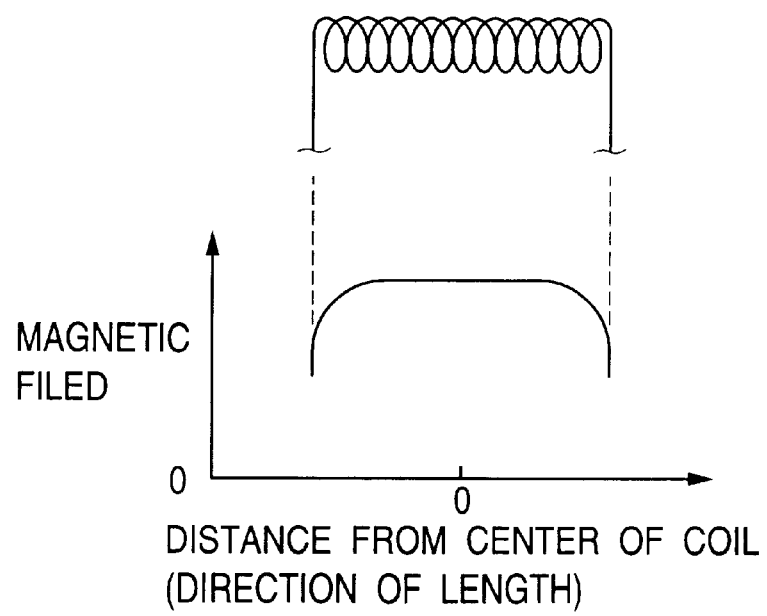
FIG. 23 is a characteristic drawing showing the intensity of a magnetic field generated by feeding direct current to the coil for applying a biased magnetic field.

As shown in FIG. 19, reference characters W1 and W2 denote a magnetic wire composed of an amorphous wire, and a coil for applying a biased magnetic field to these magnetic wires W1 and W2 and a power source for supplying direct current to the coil are now shown. It is to remove the effect of earth magnetism and others as described later that two magnetic sensors are used. Reference characters U1 to U6 denote inverter circuits (hereinafter called inverters) housed in one C-MOS package made of a type number TC74HCU04 and others manufactured by Toshiba Corp. for example. The input terminal of the inverter U1 is connected to a direct current source Vcc of 5 V for example via a diode D1 for protecting the inverter U1 and is grounded via a diode D2 for also protecting the inverter U1. The output terminal of the inverter U1 is connected to the input terminal of an inverter U2 and is connected to the input terminal of the inverter U1 via a resistor R1. The output terminal of the inverter U2 is connected to the input terminal of the inverter U1 via a capacitor C1 and is connected to one end of a capacitor C2. An oscillating circuit is constituted by the inverters U1 and U2, the resistor R1 and the capacitor C1, the resistor R1 and the capacitor C1 are a resistor and a capacitor respectively for setting a time constant and the oscillation frequency of the oscillating circuit is determined based upon the resistance value of the resistor R1 and the capacity of the capacitor C1. The other end of the capacitor C2 is connected to a power source Vcc via a resistor R3, is grounded via a resistor R2 and is further connected to each input terminal of the inverters U3, U4, U5, and U6. A diode D3 for protection is connected in parallel to the resistor R3 and controls so that voltage exceeding rating is prevented from being applied to the inverters U3 to U6. A differentiating circuit is constituted by the capacitor C2 and the resistor R3 and the level of voltage applied to the inverters U3 to U6 is set by the resistors R2 and R3. The input terminals of the inverters U3 to U6 are connected to each other, the output terminals of the inverters U3 and U4 are connected, the node is grounded via a resistor R4 for limiting current and a magnetic wire W1, the output terminals of the inverters U5 and U6 are connected and the node is grounded via a resistor R5 for limiting current and a magnetic wire W2. The output voltage of the magnetic wires W1 and W2 can be extracted from a node a between the resistor R4 and the magnetic wire W1 and a node b between the resistor R5 and the magnetic wire W2. These nodes a and b are connected to two input terminals (an inverting input terminal and a noninverting input terminal) of a differential amplifier not shown and a signal according to a detected magnetic field can be extracted as voltage from the output terminal of the differential amplifier.

The reason why two magnetic sensors are used will be described below. A magnetic sensor with the MI device of the present invention is sensitive enough to detect earth magnetism. Therefore, only one magnetic sensor detects a magnetic field which comprises a magnetic field induced from a detected object and a disturbed magnetic field such as earth magnetism. Two magnetic sensors are arranged apart so that the orientations of the magnetic wires W1 and W2 are equal, in measurement one magnetic sensor (for example, a magnetic sensor provided with the magnetic wire W1) is arranged near a detected object and the other magnetic sensor (for example, a magnetic sensor provided with the magnetic wire W2) is arranged apart from the detected object. When difference between outputs obtained from both magnetic sensors is acquired, a signal corresponding to a magnetic field from which a disturbed magnetic field such as earth magnetism is removed (that is, a magnetic field detected from a detected object) can be obtained.

Next, the operation of the above driving circuit will be described. A signal with a rectangular waveform (duty ratio is approximately 50%) of a frequency (for example, 400 kHz) determined by the resistor R1 and the capacitor C1 is output from the oscillating circuit constituted by the inverters U1 and U2, the resistor R1, and the capacitor C1. The rectangular signal is changed to a differential waveform (a waveform the leading edge and the trailing edge of which are sharp) by the differential circuit constituted by the capacitor C2 and the resistor R3, the voltage level of the differential waveform is regulated at the resistors R2 and R3, each waveform is inverted and current in the shape of a sharp pulse is applied to the magnetic wire W1 via the resistor R4. Similarly, current in the shape of a sharp pulse is applied to the magnetic wire W2 via the resistor R5 by the inverters U5 and U6. As a result, a signal according to a detected magnetic field can be obtained from the output terminal of the differential amplifier (not shown) connected to the nodes a and b.

Pulsed current, and not a sine wave, is applied to the magnetic wire in the driving circuit such that the skin effect causes a change in the impedance of the magnetic wire by an external magnetic field. That is, it is required to feed high frequency current to the magnetic wire so as to obtain magnetic impedance effect because skin effect is increased as the frequency of current is increased. However, as the constitution of a circuit becomes complicated for obtaining high frequency sinusoidal current, the driving circuit is constituted so that high frequency current substantially flows to the magnetic wire by applying pulsed current including a higher frequency component than an oscillation frequency to the magnetic wire.

The more current flowing to the magnetic wire, the larger the output that can be obtained from the magnetic wire, however, as in the inverters U3 to U6, the quantity of current to flow is determined (for example, 25 mA per inverter) based upon the characteristic of IC, the driving circuit is constituted so that twice as much current as one inverter can be fed to the magnetic wire W1 by connecting the two inverters U3 and U4 in parallel. Further, even if excessive current flows to the two inverters U3 and U4, the inverters are prevented from being destroyed owing to the resistor R4. In the case of the inverters U5 and U6, circumstances are also the same as in the case of the inverters U3 and U4.

The magnetic sensor according to the present invention is embodied in the above embodiments and produces the following effect:

As the wound range of the coil for applying a biased magnetic field includes the electric connection of the magnetic wire and the conductive member and is set so that the wound range is longer than the sensing part of the magnetic wire, an uneven magnetic field caused at both ends of the wound part of the coil is unlikely to have an effect upon the sensing part of the magnetic wire and an approximately uniform biased magnetic field can be applied in the longitudinal direction of the sensing part. Therefore, a graph showing correlation between output (voltage) obtained from the sensing part of the magnetic wire and an external magnetic field is shifted by the quantity of the biased magnetic field without changing the shape, an operating point can be set to desired coordinates on which the linearity of the graph can be secured and the precision of detection as a magnetic sensor can be enhanced. As the coil is wound on the supporting board for supporting the magnetic wire, assembling and handling of the magnetic sensor are facilitated, compared with a case that the coil is wound on the tube such as vinyl. If the magnetic wire mounting member in the shape of a pin for example for temporarily fixing the magnetic wire onto the supporting board is used, the attachment strength and the reliability of the conduction of the magnetic wire can be greatly enhanced by securely soldering the mounting member on the conductive part such as the soldering land on the supporting board.

What is claimed is:

1. A magnetic sensor, comprising:
a magnetic wire having a sensing part which detects an external magnetic field, in which a voltage generated in the magnetic wire by applying one of an alternating current and a pulsating current to the magnetic wire is varied by changes in the external magnetic field;
a supporting board supporting the magnetic wire;
a first and second conductive section provided spaced apart from each other on the supporting board, the first conductive section electrically connected to a first end of the magnetic wire and the second conductive section electrically connected to a second end of the magnetic wire;
a first and second magnetic-wire mounting member, the first magnetic-wire mounting member soldered to the first conductive section and electrically connected to a first end of the sensing part, the second magnetic-wire mounting member soldered to the second conductive section and electrically connected to a second end of the sensing part, the magnetic wire being supported at the first and second ends thereof together with the supporting board; and
a coil wound around said magnetic wire and said supporting board such that a bias magnetic field is applied thereto, wherein:
a range of winding of said coil is longer than at least the sensing part of the magnetic wire and portions electrically connecting the magnetic wire and the first and second magnetic-wire mounting members.

2. A magnetic sensor according to claim 1, wherein:
each of said first and second magnetic wire mounting members is formed in the shape of a pin provided with a leg; and
a first and second mounting hole are provided to said supporting board, the leg of said first and second magnetic wire mounting members are inserted into said first and second mounting hole respectively.

3. A magnetic sensor according to claim 1, wherein:
a first and second coil mounting member mounted on said supporting board outside said first and second conductive sections are provided; and
said coil is electrically connected to the first and second coil mounting members.

4. A magnetic sensor according to claim 1, wherein:
a cover member is provided on said supporting board such that the cover member covers said magnetic wire; and
said coil is wound on the cover member and said supporting board.

5. A magnetic sensor according to claim 4, wherein:
a positioning part regulating a position and a range of winding of said coil is provided on at least one of said supporting board and said cover member.

6. A magnetic sensor according to claim 5, wherein:
said positioning part is a notch.

7. A magnetic sensor according to claim 1, wherein:
said supporting board is a subboard mounted on a mother board.

8. A magnetic sensor according to claim 1, wherein:
at least said magnetic wire, said supporting board and said coil are sealed inside a mold composed of insulating resin; and
terminals leading to said magnetic wire and said coil protrude outside said mold.

9. A magnetic sensor, comprising:
a magnetic wire having a sensing part which detects an external magnetic field, in which a voltage generated in the magnetic wire by applying one of an alternating current and a pulsating current to the magnetic wire is varied by changes in the external magnetic field;
a first and second conductive section, the first and second conductive section respectively electrically connected to a first and a second end of the magnetic wire;
a supporting board supporting the magnetic wire, said first and second conductive sections provided spaced apart on said supporting board;
a coil wound around said magnetic wire such that a bias magnetic field is applied thereto; and
a positioning part, provided on said supporting board, the positioning part regulating a position of said coil to define a range of winding of said coil;
wherein the range of winding of said coil is set by said positioning part to be longer than at least the sensing part of the magnetic wire and portions electrically connecting the magnetic wire and the first and second conductive sections.

10. A magnetic sensor according to claim 9, further comprising:
a first and second magnetic wire mounting member, said magnetic wire mounting members mounted on said supporting board, the first magnetic-wire mounting member soldered to the first conductive section and electrically connected to a first end of the sensing part, the second magnetic-wire mounting member soldered to the second conductive section and electrically connected to a second end of the sensing part, the magnetic wire being supported at the first and second ends thereof together with the supporting board.

11. A magnetic sensor according to claim 10, wherein:
each of said first and second magnetic wire mounting members are formed in the shape of a pin provided with a leg; and
a first and second mounting hole are provided to said supporting board, the leg of said first and second magnetic wire mounting members are inserted into said first and second mounting hole respectively.

12. A magnetic sensor according to claim 9, wherein:
a first and second coil mounting member mounted on said supporting board outside said first and second conductive section are provided; and
said coil is electrically connected to said first and second coil mounting members.

13. A magnetic sensor according to claim 9, wherein:
a cover member is provided on said supporting board such that the cover member covers said magnetic wire; and
said coil is wound on the cover member and said supporting board.

14. A magnetic sensor according to claim 9, wherein said positioning part is a notch.

15. A magnetic sensor according to claim 9, wherein said supporting board is a subboard mounted on a mother board.

16. A magnetic sensor according to claim 9, wherein:
at least said magnetic wire, said supporting board and said coil are sealed inside a mold composed of insulating resin; and
terminals leading to said magnetic wire and said coil protrude outside said mold.

UNITED STATES PATENT AND TRADEMARK OFFICE
CERTIFICATE OF CORRECTION

PATENT NO.     : 6,121,770
DATED          : September 19, 2000
INVENTOR(S)    : Yoshihiro Sudo It is certified that error appears in the above-identified patent and that said Letters Patent is hereby corrected as shown below:

Title page,
Item [73], Assignee, change "Frontec Incorporated, Miyagi-ken, Japan" to
-- Alps Electric Co., Ltd., Tokyo, Japan --.

Signed and Sealed this

Twenty-ninth Day of June, 2004

JON W. DUDAS
*Acting Director of the United States Patent and Trademark Office*